United States Patent [19]

Waldrop et al.

[11] Patent Number: 4,833,042
[45] Date of Patent: May 23, 1989

[54] NONALLOYED OHMIC CONTACTS FOR N TYPE GALLIUM ARSENIDE

[75] Inventors: James R. Waldrop; Ronald W. Grant, both of Thousand Oaks, Calif.

[73] Assignee: Rockwell International Corporation, El Segundo, Calif.

[21] Appl. No.: 148,797

[22] Filed: Jan. 27, 1988

[51] Int. Cl.[4] .................... H01L 23/48; H01L 21/265
[52] U.S. Cl. .................... 428/641; 148/DIG. 140; 148/DIG. 139; 428/620; 437/39; 437/176; 437/177
[58] Field of Search ............... 428/620, 641; 437/176, 437/177, 39

[56] References Cited

U.S. PATENT DOCUMENTS

| | | | |
|---|---|---|---|
| 4,298,403 | 11/1981 | Davey et al. | 437/945 |
| 4,398,963 | 8/1983 | Stall et al. | 437/184 |
| 4,421,577 | 12/1983 | Spicer | 437/39 |
| 4,540,446 | 9/1985 | Nonaka et al. | 148/DIG. 140 |
| 4,559,238 | 12/1985 | Busatti et al. | 437/39 |
| 4,583,110 | 4/1986 | Jackson et al. | 148/DIG. 140 |
| 4,593,307 | 6/1956 | Rupprecht et al. | 148/DIG. 140 |
| 4,662,060 | 5/1987 | Aina et al. | 437/176 |
| 4,665,278 | 5/1987 | Takada et al. | 437/190 |

OTHER PUBLICATIONS

Jackson et al, Jour. Vac. Sci. Technol. B-3 (1985), 1676.
Östing et al, Jour. Vac. Sci. Technol. A-2 (1984), 281.
Lau et al, Appl. Phys. Lett., 47 (1985), 1298.
Uchida et al, Appl. Phys. Lett., 50 (1987), 670.
Waldrop et al, Appl. Phys. Lett., 47 (1985), 1301.
R. A. Stall et al, A Study of Ge/GaAs Interfaces Grown by Molecular Beam Epitaxy, J. Appl. Phys. 52(6), Jun. 1981, pp. 4062–4069.
J. V. DiLorenzo et al, Nonalloyed and In Situ Ohmic Contacts to Highly Doped n-Type GaAs Layers Grown by Molecular Beam Epitaxy (MBE) for Field-- Effect Transistors, J. Appl. Phys. 50(2), Feb. 1979, pp. 951–954.
E. D. Marshall et al, Non–Alloyed Ohmic Contact to n-GaAs by Solid Phase Epitaxy, Appl. Phys. Lett. 47(3), 1 Aug. 1985, pp. 298–300.
M. J. Hafich et al, Heterojunction Ohmic Contacts to Si Using Ge/Si n+/n+ Structures, Mat. Res. Soc. Symp. Proc., vol. 54, 1986 Materials Research Society, pp. 511–514.
J. R. Waldrop, Direct Variation of Metal-GaAs Schottky Barrier Height by the Influence of Interface S, Se, and Te, Appl. Phys. Lett. 47(12), 15 Dec. 1985, pp. 1301–1303.
R. Stall et al, Ultra Low Resistance Ohmic Contacts to n-GaAs, Electronics Letters, vol. 15, No. 24, 22 Nov. 1979, pp. 800–801.

Primary Examiner—Upendra Roy
Attorney, Agent, or Firm—H. Fredrick Hamann; Craig O. Malin; Wilfred G. Caldwell

[57] ABSTRACT

The invention is a layered nonalloyed ohmic contact structure for use on n type gallium arsenide including a layer of germanium or silicon of the order of 10 Å thick evaporated onto the gallium arsenide; a diffusion barrier layer of material 100–200 Å thick over the germanium or silicon selected from non-metallic conducting compounds, including metal compounds of
  arsenide
  phosphide
  carbide
  boride
  nitride
  silicide
and non-metallic conducting elements; with the diffusion barrier layer material characterized by resistivity of the order of 1 ohm cm or less; and a conducting metal overlayer on the diffusion barrier layer. The invention includes the method for manufacturing the contact structure.

3 Claims, 4 Drawing Sheets

NONALLOYED OHMIC CONTACTS FOR N TYPE GALLIUM ARSENIDE

This invention was made with Government support under contract No. F49620-85-C-0120, awarded by The Air Force. The Government has certain rights in this invention.

BACKGROUND OF THE INVENTION

1. Field of the Invention

Forming layered ohmic contacts to n type GaAs.

2. Prior Art

Alloyed ohmic contacts to GaAs have been known and used for many years. It has not been established that alloyed contacts reduce barrier height at GaAs interfaces.

Nonalloyed ohmic contacts to GaAs and other semiconductors are increasingly important as device dimensions decrease. Many semiconductors (including GaAs) exhibit a narrow range of Fermi level positions at the interfaces of electrical contacts. This range is typically not optimum for nonalloyed tunneling ohmic contact applications because the specific contact resistance depends exponentially on barrier height. Gallium Arsenide is a semiconductor where the Schottky barrier height on n type material is usually limited to a narrow range (0.7 to 0.9 eV) for metal contacts. This large barrier is thus an impediment to achieving a low ohmic contact resistance. In one approach to a nonalloyed ohmic contact to GaAs, a 0.5 eV Au Schottky barrier contact is made to a ~250 Å thick Ge heterojunction layer grown epitaxially onto the GaAs, which has the effect of transferring the primary barrier to current flow from the metal-GaAs interface to the metal-Ge interface (R. Stall, et al, Electron. Lett. 15 800 (1979)).

SUMMARY OF THE INVENTION

The invention deposits ultra thin layers (on the order of 10 Å) of another heavily doped semiconductor onto the semiconductor being considered. For n GaAs, heavily n type doped Ge or Si can lower the Schottky barrier height to ~0.25–0.4 eV. By use of a suitable nonmetallic conducting diffusion barrier, this low Schottky barrier height can be retained for metal contacts of thickness (>2000 Å) that are suitable for practical applications. (The low barrier is not retained if the contact metal is directly against the thin semiconductor over layer.) The role of the diffusion barrier is thus to isolate the semiconductor interface from the metal contact material while also providing a conducting electrical contact. The intermediate conducting layer does not itself introduce any electrical potential barrier. The ultra thin heavily doped semiconductor layer either removes or overcomes the mechanism responsible for the normally observed narrow range of interface Fermi level positions but is thin enough so as not to introduce significant series resistance.

DESCRIPTION OF THE PREFERRED EMBODIMENT

Figure 1:
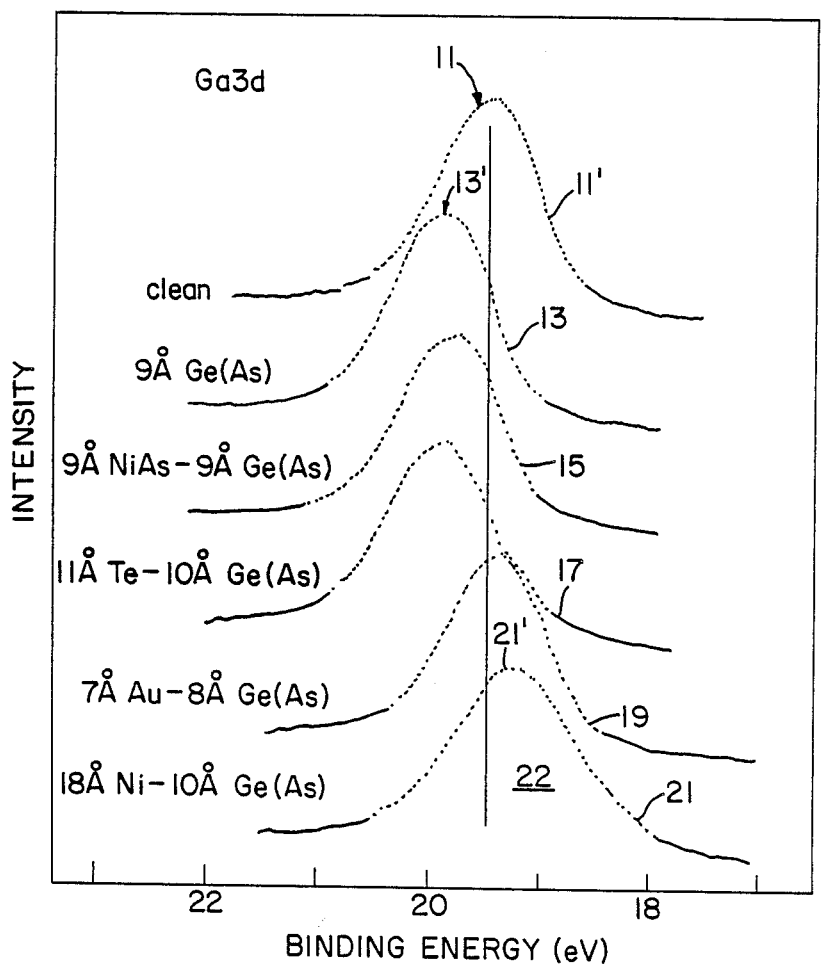
FIG. 1 shows XPS Ga 3d core level spectra for various thin overlayer structures on initially clean GaAs (100) surfaces with the upper three spectra depicting successive depositions on the same sample, the ordinate depicting INTENSITY and the abscissa BINDING ENERGY.

The alloyed AuGeNi metallization is widely used as an ohmic contact to n type GaAs. The complex contact structure consists of several phases whose individual size and composition depend on the alloying time and temperature. The familiar ohmic contact tunneling model that gives $\rho_c \propto \exp(a\phi_B/N_D^{\frac{1}{2}})$, where $\rho_c$ is the specific contact resistance, $\phi_B$ is the interface barrier height, $N_D$ is the donor concentration in the GaAs ($> \sim 5 \times 10^{18}$ cm$^{-3}$), and $a = 5 \times 10^{10}$cm$^{-3/2}$eV$^{-1}$, is troublesome to apply quantitatively to the alloyed contact. This difficulty arises from not knowing precisely either $\phi_B$ or the effect of Ge, Au, or Ni diffusion on $N_D$. It is usually assumed that $\phi_B$ is inevitably ~0.7–0.9 eV because the Schottky barrier height for most metal contacts to GaAs is in this range. According to this viewpoint $\rho_c$ is reduced by maximizing $N_D$. However, for certain thin (~10–40Å) Ge overlays on clean GaAs surfaces the interface Fermi energy $E_{F^i}$ can be >1 eV. Hence, if such a high $E_{F^i}$ state (low $\phi_B$) can be attained in a tunnel AuGeNi ohmic contact then $\rho_c$ would be substantially reduced for a given $N_D$.

This invention discloses novel ohmic contacts to GaAs that involve layered structures. The contacts were not alloyed to retain interfaces of controlled composition. The interface chemistry and $E_{F^i}$ during initial contact formation were observed by x-ray photoemission spectroscopy (XPS); the corresponding $\phi_B$ for a thick contact was obtained by current-voltage (I-V) measurement. Since the current transport for a tunnel contact depends on both $\phi_B$ and $N_D$, GaAs with $N_D$ appropriate for thermionic emission transport ($<10^{17}$ cm$^{-3}$) was used to simplify the I-V analysis.

The contact interfaces were prepared under ultrahigh vacuum conditions ($10^{-10}$ Torr range base pressure) in an XPS system comprised of a HP5950A electron spectrometer (hv=1486.6 eV monochromatic x-ray source, ~16Å effective photoelectron escape depth) and attached custom sample preparation chamber. During initial contact formation XPS spectra of the Ga 3d and As 3d core level peaks in the GaAs and of other core level peak spectra appropriate for a given interface composition were obtained, I-V data were obtained in 0.01 V forward bias increments.

In one example, GaAs (100) material is liquid encapsulated Czochralski grown n type (~5×10$^{16}$cm$^{-3}$Se). To prepare a sample, the GaAs is etched in fresh 4:1:1H$_2$SO$_4$:H$_2$O$_2$:H$_2$O solution for ~30 s to remove polishing damage, mounted on a Mo plate with In, and immediately put into the XPS system. The ~10 Å native oxide is removed by momentary heating, either in vacuum or in an As overpressure, to the minimum necessary temperature (~550° C., which also forms an ohmic contact between the GaAs and the Mo plate). This thermally cleaned surface is ordered [displays a characteristic low-energy electron diffraction (LEED) pattern] and is shown by XPS to be free of oxygen, carbon, or other contaminants. The Ge, Au, and Ni were evaporated from W baskets; the As and Te sources were small quartz ovens. The NiAs layers were formed by depositing the Ni onto a room-temperature substrate in a $10^{-7}$–$10^{-6}$ Torr As overpressure [although XPS analysis indicates the resulting Ni and As layer is As rich, and thus a compound(s) of the form $NiAs_x$, for simplicity it will be referred to as NiAs]. After XPS analysis of thin overlayers, a total overlayer 31 (FIG. 4) thickness of >2000 Å of the contact metal was deposited Circular $2.54 \times 10^{-2}$ cm diameter contacts were defined by using photolithography and chemical etching.

It should be understood that when using bulk GaAs, the etching step is provided to remove damage occassioned by wafer fabrication. If GaAs is epitaxially grown on a wafer, the etching step may not be necessary. Etching may be carried out with any conventionally used etches.

Also, the invention will work with GaAs obtained from any growth technique.

With respect to the barrier layer 30' (FIG. 4), the following characterizes the materials suitable for maintaining the barrier height low:

Non-metallic conducting compounds including metal compounds of
 arsenide
 phosphide
 carbide
 boride
 nitride
 silicide
and, non-metallic conducting elements—all of the above exhibiting resistivity of the order of 1 ohm cm or less.

Figure 2:
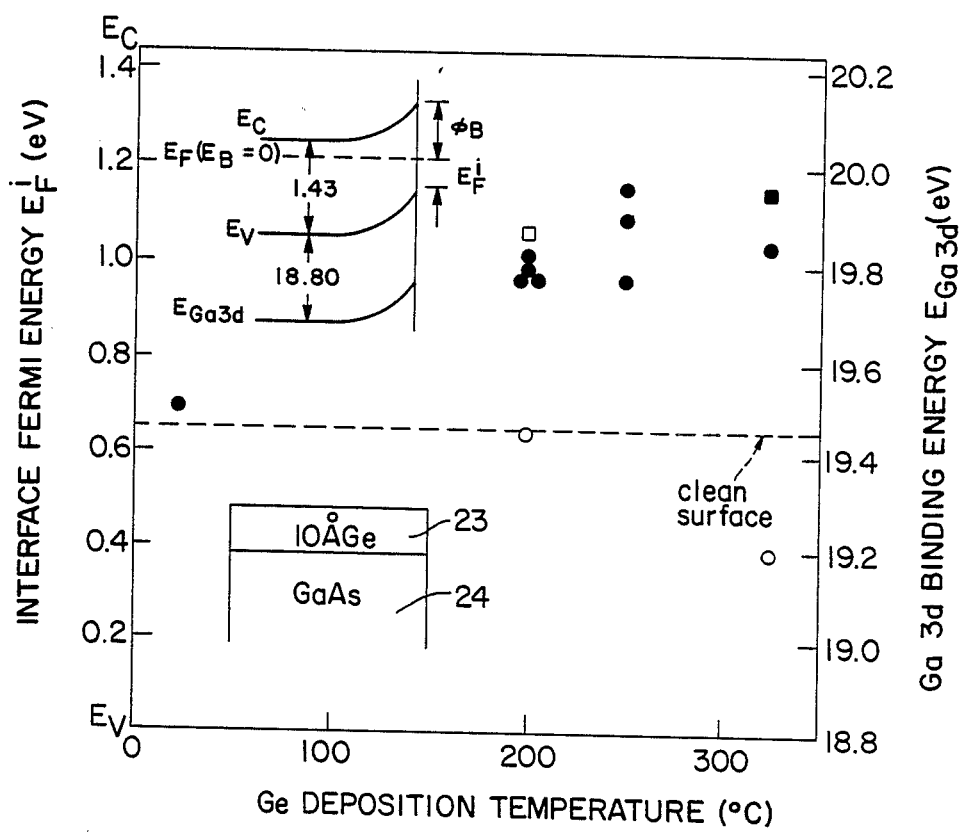
FIG. 2 plots Ge DEPOSITION TEMPERATURE (°C.) against INTERFACE FERMI ENERGY $E_{F^i}$ (eV) and Ga 3d BINDING ENERGY $E_{Ga3d}$ (eV) for thin (~10 Å) Ge overlayers deposited on GaAs (100) surfaces at several different temperatures, the closed circles and square being for $10^{-7}$ and $10^{-6}$ Torr As overpressure during Ge evaporation, the open circles being for a GaAs surface cleaned and Ge deposited in vacuum, and the open square is for GaAs cleaned in $10^{-6}$ Torr As and Ge deposited in vacuum.

The representative Ga 3d core level peak data plotted in FIG. show how XPS was used to measure $E_F{}^i$ and to monitor composition during interface formation. The upper three spectra 11, 13, 15 are after sequential treatments to the same sample; the lower three 17, 19, 21 are for three other samples with the indicated overlayer structure (peak heights are normalized). The upper inset in FIG. 2 shows the relationship between the interface Ga 3d core level binding energy in GaAs and $E_F{}^i$: $E_F{}^i = E_{Ga\ 3d} - 18.80 eV$, where ($E_{Ga\ 3d} - E_v) = 18.80 \pm 0.03$ eV is the energy difference between the Ga 3d core level and the valence-band maximum. Note that the binding energy $E_B$ scale is referenced to the sample Fermi energy $E_F$ (other details on the use of XPS to measure $E_F{}^i$ can be found elsewhere). Thus, the vertical line 22 in FIG. 1 that marks the center of the clean surface Ga 3d peak at 19.47 eV is for $E_F{}^i$ (clean) =0.67 eV (the average for 16 samples is 0.66 eV, as indicated in FIG. 2).

After deposition of 9Å of Ge onto the clean GaAs surface at 250° C. and in $1 \times 10^{-7}$ Torr As overpressure, the Ga 3d peak shifts 0.43 eV to higher binding energy (compare upper two peaks 11', 13'). This shift represents an increase in $E_F{}^i$ to 1.10 eV. The $E_F{}^i$ for a thin Ge overlayer on clean GaAs will be defined as $E_F{}^i$ (Ge).

Germanium may be replaced by silicon as a semiconductor material for use to interface with the gallium arsenide. Silicon also produces a set of curves corresponding to FIG. 1. It is necessary when using either Si or Ge to heavily dope these semiconductors. The doping should be sufficient to produce degenerate n doping having a concentration, by way of example, of the order of $1 \times 10^{19}$ arsenic or phosphorus atoms or ionized impurities per $cm^3$.

FIG. 2 gives the value of $E_F{}^i$ (Ge) for 13 different samples in which ~10 Å of Ge 23 was deposited onto clean GaAs 24 (see lower inset) at several different substrate temperatures and As overpressure conditions. These $E_F{}^i$ (Ge) data are also tabulated in Table I.

TABLE I

Correlation of interface composition and barrier height for model nonalloyed AuGeNi contacts to GaAs.

| Interface structure | Ge depos. temp. (°C.) | $E_F{}^i(Ge)^a$ (eV) | $\phi_B{}^{b,c}$ (eV) | n |
|---|---|---|---|---|
| Au—NiAs—9Å Ge(As) | 200 | 0.98 | $0.31^d$ | 1.27 |
| Au—NiAs—11Å Ge(As) | 200 | 0.98 | $0.35^d$ | 1.23 |
| Au—NiAs—9Å Ge(As) | 250 | 1.10 | $0.39^d$ | 1.11 |
| Au—100Å Te—10Å Ge(As) | 200 | 1.07 | $0.23^e$ | 1.33 |
| Au—100Å Te—9Å Ge(As) | 250 | 1.16 | $0.39^d$ | 1.08 |
| Au—100Å Te—7Å Ge(As) | 325 | 1.05 | $0.36^d$ | 1.10 |
| Au—10Å Ge(As) | 200 | 1.02 | 0.76 | 1.05 |
| Au—8Å Ge(As) | 250 | 0.98 | 0.61 | 1.05 |
| Au—9Å Ge(As) | 325 | 1.16 | 0.64 | 1.05 |
| Ni—10Å Ge(As) | 200 | 0.99 | 0.81 | 1.11 |
| Au—100Å Te—9Å Ge | 200 | 0.65 | 0.65 | 1.06 |
| Au—9Å Ge | 325 | 0.40 | 0.71 | 1.12 |
| Au—100Å Te$^f$ | — | — | 0.79 | 1.02 |
| NiAs—ideal | — | — | 0.80 | 1.04 |
| Ni—ideal | — | — | 0.84 | 1.05 |
| Au—ideal | — | — | 0.89 | 1.05 |

$^a$Ge overlayer only.
$^b$Includes image force correction, see text.
$^c$Measured at T = 295K unless noted.
$^d$T = 150K.
$^e$T = 100K.
$^f$J. R. Waldrop, APPL. PHYS. LETT. 47, 1301 (1985).

For Ge deposited in a 200°–325° C. temperature range under conditions where As incorporation occurs [designated Ge(As)], which presumably makes the Ge heavily n type, $E_F{}^i$(Ge) =1.0–1.2 eV. A LEED pattern from the Ge was observed for these layers (with a high background at 200° C.). Room-temperature Ge deposition (no LEED pattern), or 200°–325° C. Ge deposition on a vacuum cleaned surface without an As overpressure, yields $E_F{}^i$ (Ge)=0.4–0.7 eV.

The relation $\phi_B = 1.43$ eV $- E_F{}^i$ indicates that barriers in the 0.2–0.4 eV range can be achieved if the low band bending state (high $E_F{}^i$) can be preserved upon deposition of additional contact material. For example, the third (from top) spectrum 15 in FIG. 1 is for 9 Å of NiAs deposited onto the 9 Å Ge(As) overlayer where $E_F{}^i$(Ge) =1.1 eV. Essentially no change in the Ga 3d energy, and hence no change in $E_F{}^i$, occurs. To test the generality of this result another conductive nonmetal, Te, was used. When 11 Å of Te is deposited onto a Ge(As) overlayer with high associated $E_F{}^i$(Ge) (fourth spectrum 17) there is also no change in $E_F{}^i$. The situation is dramatically different when either Au or Ni is deposited directly onto a high $E_F{}^i$(Ge) Ge(As) overlayer (lower two spectra 19, 21 in FIG. 1). In each case $E_F{}^i$ shifted from $E_F{}^i$(Ge)= ~1.1 eV to $E_F{}^i$= ~0.7 eV after the metal deposition; thus, the low barrier condition was removed (the low binding energy shoulder in the last peak 21' is due to a Ni-GaAs chemical reaction).

Do the XPS measurements of $E_F^i$ shifts correlate with the I-V $\phi_B$ data for the same interfaces? To investigate this question several kinds of model thick contact structure were formed. Some types that include Ge are shown on the right side of FIG. 3; in each case an initial Ge overlayer is followed (at room temperature) by the indicated depositions. Not shown are structures without the Ge layer (with their I-V curves 26, 27, 28 designated ideal; in FIG. 3) where Au, Ni, or NiAs is deposited directly onto clean GaAs.

Figure 3:
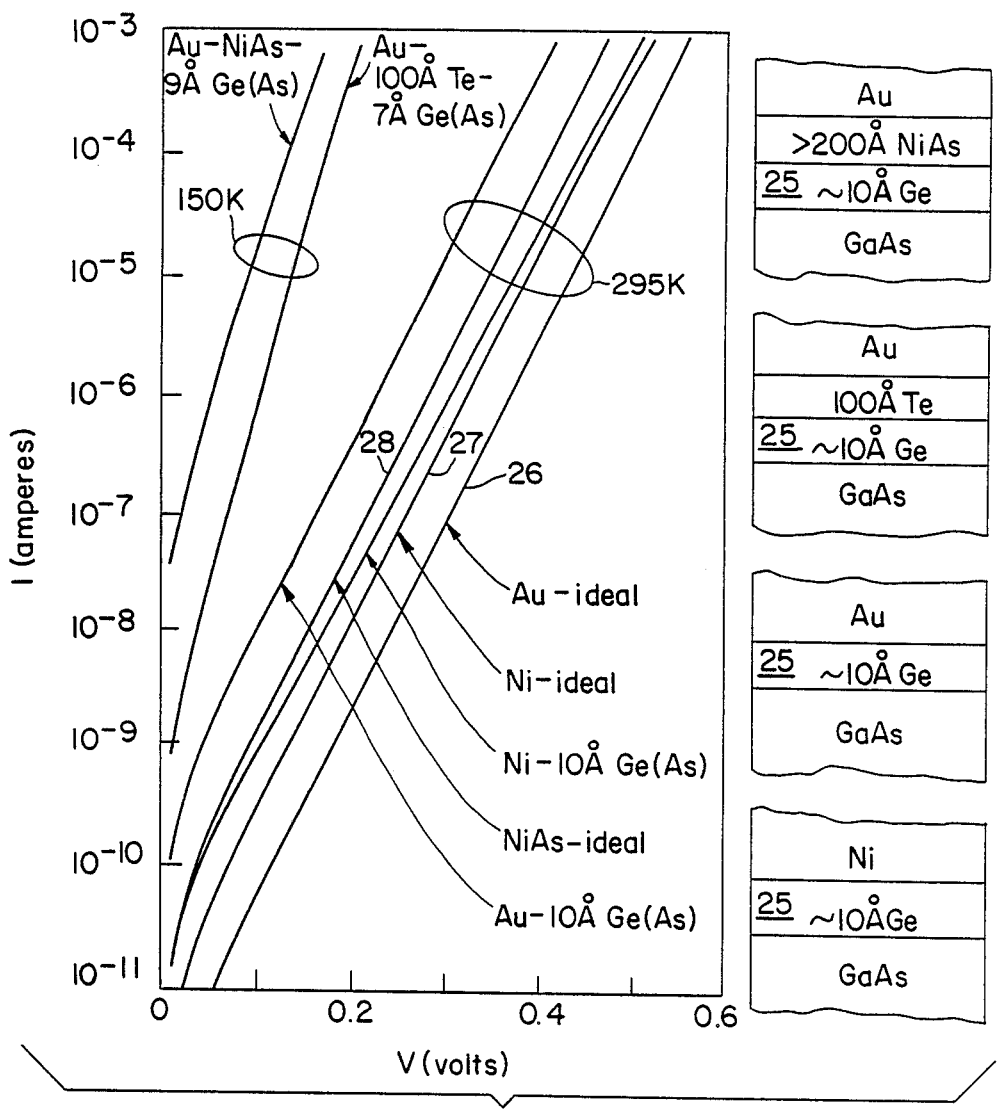
FIG. 3 shows representative CURRENT (I) - VOLTS (V) data for a selection of contacts to GaAs that have a variety of structures (contact area $=5.07 \times 10^{-4}$ cm$^2$) and on the right are schematically shown multilayered contact structures; and, FIG. 4 depicts a portion of a GaAs substrate with layered contact structure in accordance with the present invention thereon.

FIG. 3 also shows representative I-V data (T=295 or 150 K, the lower measurement temperature was necessary for low $\phi_B$) that demonstrate the wide range in $\phi_B$ which is associated with the different contact structures. The I-V data were analyzed by use of the thermionic emission model for a Schottky barrier: $I = I_s \exp(qV/nkT) [1-\exp(-qV/kT)]A$, where both the ideality factor n (n~1.02 at T=295 K is ideal; there is often, however, an increase in n at low T) and $I_s$ were determined by a least-squares fit. The barrier height $\phi_B$ is extracted from $I_s$ by $I_s = SA^*T^2 \times \exp[-q(\phi_B - \Delta\phi)/kT]A$, where S is the contact area, $A^* = 8.16$ is the effective Richardson constant, and $\Delta\phi$ is the calculated image force correction ($\Delta\phi = +0.04$ eV for $\phi_B \geq 0.7$ eV and $+0.03$ eV for $\phi_B < 0.7$ eV). Table I lists the average $\phi_B$ and n values for the various interface structures (~seven contacts per sample, $< \pm 0.01$ eV measurement uncertainty).

The Au-NiAs-Ge(As) and Au-Te-Ge(As) contacts that have a high $E_F^i$(Ge) (~1.0–1.2 eV) also have a low $\phi_B$(~0.25–0.04 eV). In contrast, the Au-Ge(As) and Ni-Ge(As) contacts that have a similarly high $E_F^i$(Ge) value have, without an intervening NiAs or Te layer, a high $\phi_B$ (~0.6–0.8 eV). These values for $\phi_B$ can be compared to those for the Au and Ni ideal contacts, $\phi_B$ (Au)=0.89 and $\phi_B$ (Ni)=0.84 eV, and the two contacts where $E_F^i$(Ge) was 0.4 and 0.65 eV. Thus, a high $E_F^i$ state induced by a Ge(As) layer can be preserved by a NiAs or Te layer that prevents Au or Ni from reaching the Ge-GaAs interface.

The NiAs-ideal and the Au-100 Å Te contacts have $\phi_B = 0.79$–0.80 eV, which corresponds to $E_F^i = 0.63$–0.64 eV; this value of $E_F^i$ is essentially that of the clean GaAs surface. Thus, NiAs and Te have no effect on the Ge-GaAs interface electronic structure while also providing a conducting electrical contact.

Figure 4:
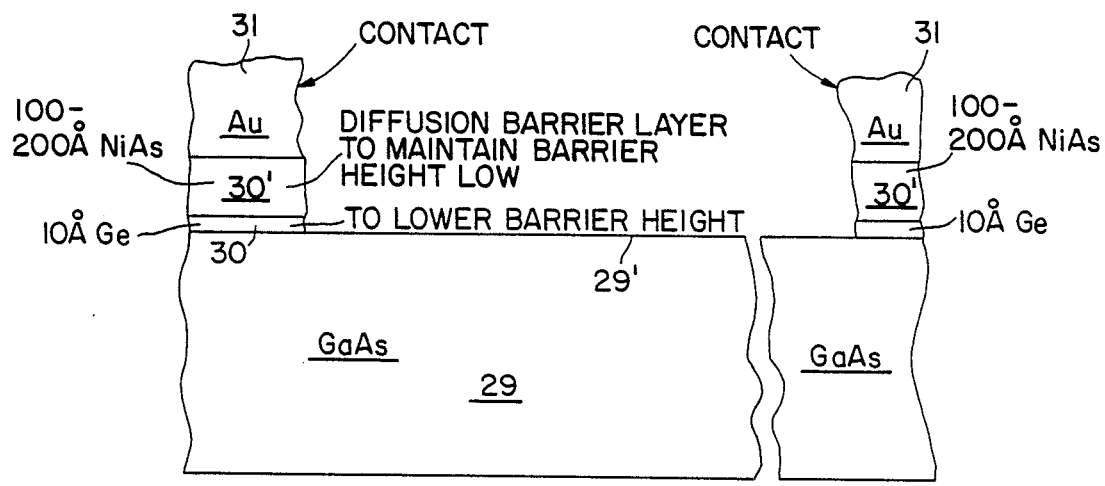

In FIG. 4, an example of a contact formed by the method of the present invention is depicted. The GaAs wafer 29 has a clean upper surface 29' onto which is deposited, by evaporation, a 10 Å Ge layer which provides the contact layer 30 for lowering the barrier height.

Next, an evaporated layer 30' of 100 Å–200 Å NiAs is deposited over the Ge to function as a DIFFUSION BARRIER LAYER to maintain the barrier height at its lowered level or height.

Finally, the contact overlayer 31 of gold is evaporated onto the layer 30', and conventional photoresist etching techniques are employed to delineate the contact layered structures. Any metal may be substituted for gold because there is no alloying.

The invention contemplates the use of the other elements and materials herein defined, in various combinations, all resulting in known layered structures.

What is claimed is:

1. A layered nonalloyed ohmic contact structure (for use on n type gallium arsenide,) comprising in combination:

a n heavily doped degenerate layer of one of germanium and silicon of the order of 10 Å thick on the gallium arsenide;

a diffusion barrier layer of material over the layer of one of germanium and silicon selected from the following:

non-metallic conducting compounds, including metal compounds of
   arsenide
   phosphide
   carbide
   boride
   nitride
   silicide
   and non-metallic conducting elements;

said diffusion barrier layer material characterized by resistivity of the order of 1 ohm cm or less; and, a conducting metal overlayer on said diffusion barrier layer.

2. The contact structure of claim 1, wherein:
   the material of said diffusion barrier is nickel arsenide.

3. The contact structure of claim 1, wherein:
   the material of said diffusion barrier is tellurium.

* * * * *